(12) United States Patent
Kawabata

(10) Patent No.: US 10,847,438 B2
(45) Date of Patent: Nov. 24, 2020

(54) BONDING SHEET AND MANUFACTURING METHOD THEREOF, AND HEAT DISSIPATION MECHANISM AND MANUFACTURING METHOD THEREOF

(71) Applicant: FUJITSU LIMITED, Kawasaki (JP)

(72) Inventor: Akio Kawabata, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 108 days.

(21) Appl. No.: 16/168,360

(22) Filed: Oct. 23, 2018

(65) Prior Publication Data

US 2019/0057925 A1 Feb. 21, 2019

Related U.S. Application Data

(63) Continuation of application No. 14/974,311, filed on Dec. 18, 2015, now abandoned, which is a (Continued)

(30) Foreign Application Priority Data

Jun. 21, 2013 (JP) .................................. 2013-130806

(51) Int. Cl.
*H01L 23/367* (2006.01)
*B82Y 30/00* (2011.01)
(Continued)

(52) U.S. Cl.
CPC .......... *H01L 23/3677* (2013.01); *B82Y 30/00* (2013.01); *C01B 32/162* (2017.08); (Continued)

(58) Field of Classification Search
CPC ............... H01L 23/3677; H01L 23/373; H01L 2924/0002; H01L 21/486; B82Y 30/00; (Continued)

(56) References Cited

U.S. PATENT DOCUMENTS

2008/0131352 A1 6/2008 Kondo
2009/0237886 A1* 9/2009 Iwai ...................... H01L 23/373
361/708
(Continued)

FOREIGN PATENT DOCUMENTS

JP 2008-137846 A1 6/2008
JP 2009-130113 A1 6/2009
(Continued)

OTHER PUBLICATIONS

Office Action of JP Parent Application 2013-130806 dated Nov. 8, 2016; translation of the relevant part, from p. 1, line 24 to p. 3, line 12 of the Office Action.
(Continued)

*Primary Examiner* — Jun S Yoo
(74) *Attorney, Agent, or Firm* — Kratz, Quintos & Hanson, LLP

(57) ABSTRACT

A CNT-metal composite structure is formed by forming a plurality of CNTs which stand side by side from a base substance, forming a sheet-shaped support film which covers upper ends of the CNTs, and filling gaps each present between adjacent ones of the CNTs with a metal. By this structure, highly reliable bonding sheet and heat dissipation mechanism which are very excellent in heat dissipation efficiency, and manufacturing methods of these are realized.

7 Claims, 13 Drawing Sheets

Related U.S. Application Data continuation of application No. PCT/JP2014/051518, filed on Jan. 24, 2014.

(51) Int. Cl.

| | | |
|---|---|---|
| *H01L 23/373* | (2006.01) | |
| *C01B 32/162* | (2017.01) | |
| *C01B 32/184* | (2017.01) | |
| *B82Y 40/00* | (2011.01) | |

(52) U.S. Cl.
CPC .......... *C01B 32/184* (2017.08); *H01L 23/373* (2013.01); *B82Y 40/00* (2013.01); *C01B 2202/08* (2013.01); *H01L 2924/0002* (2013.01)

(58) Field of Classification Search
CPC ..... B82Y 40/00; C23C 16/0272; C23C 16/26; D01F 9/127; C01B 32/158; C01B 32/184; C01B 32/162; C01B 2202/08; F28F 21/02; H05K 7/2039
See application file for complete search history.

(56) References Cited

U.S. PATENT DOCUMENTS

| | | | |
|---|---|---|---|
| 2010/0124025 A1* | 5/2010 | Yamaguchi | ........... H01L 23/433 361/708 |
| 2010/0301260 A1* | 12/2010 | Dai | ........... C09K 5/12 252/71 |
| 2011/0008707 A1 | 1/2011 | Muraoka | |
| 2012/0168206 A1 | 7/2012 | Sekine | |
| 2012/0218713 A1 | 8/2012 | Yamaguchi | |
| 2012/0257343 A1* | 10/2012 | Das | ........... B82Y 30/00 361/679.4 |
| 2013/0228933 A1 | 9/2013 | Narwankar | |
| 2014/0140008 A1* | 5/2014 | Yamaguchi | ......... H01L 23/3672 361/705 |
| 2019/0112445 A1* | 4/2019 | Zhou | ........... C01B 32/26 |

FOREIGN PATENT DOCUMENTS

| | | |
|---|---|---|
| JP | 2009-260238 A1 | 11/2009 |
| JP | 3159198 U | 4/2010 |
| JP | 2010-173862 A1 | 8/2010 |
| JP | 2010-262928 A1 | 11/2010 |
| JP | 2010-278440 A1 | 12/2010 |
| JP | 2011-38203 A1 | 2/2011 |
| JP | 2013-8940 A1 | 1/2013 |
| TW | 200906710 A1 | 2/2009 |
| TW | 200951210 A1 | 12/2009 |
| TW | 201030135 A1 | 8/2010 |
| TW | 201105572 A1 | 2/2011 |
| TW | 201323318 A1 | 6/2013 |
| WO | 2013/046291 A1 | 4/2013 |

OTHER PUBLICATIONS

Office Action of Taiwanese Patent Application No. 103103501 dated Oct. 4, 2016; full translation of the Office Action.
International Search Report for International Application No. PCT/JP2014/051518 dated Apr. 22, 2014.
Written Opinion of the International Searching Authority for International Application No. PCT/JP2014/051518 dated Apr. 22, 2014 (4 sheets).
Office Action of Taiwanese Patent Application No. 103103501 dated Aug. 27, 2015 (5 sheets, 5 sheets translation, 10 sheets total).
Office Action of U.S. Appl. No. 14/974,311 dated Aug. 9, 2018.
Office Action of U.S. Appl. No. 14/974,311 dated Feb. 7, 2018.

\* cited by examiner

BONDING SHEET AND MANUFACTURING METHOD THEREOF, AND HEAT DISSIPATION MECHANISM AND MANUFACTURING METHOD THEREOF

CROSS-REFERENCE TO RELATED APPLICATIONS

This application is a continuation application of U.S. application Ser. No. 14/974,311, filed on Dec. 18, 2015, which is a continuation of International Application PCT/JP2014/051518 filed on Jan. 24, 2014 and designated the U.S., which claims the benefit of priority of the prior Japanese Patent Application No. 2013-130806, filed on Jun. 21, 2013, the entire contents of which are incorporated herein by reference.

FIELD

The embodiments discussed herein are directed to a bonding sheet and a manufacturing method thereof, and a heat dissipation mechanism and a manufacturing method thereof.

BACKGROUND

Carbon nanotubes (CNT) are expected as wiring and heat dissipation materials of next-generation LSI, and in order to apply them especially to a heat dissipation sheet and a substrate exhaust heat via, using vertically aligned long CNTs formed by high-temperature growth has been considered.

Patent Document 1: Japanese Laid-open Patent Publication No. 2010-262928

Patent Document 2: Japanese Laid-open Patent Publication No. 2010-173862

Patent Document 3: Japanese Laid-open Patent Publication No. 2011-38203

Patent Document 4: Japanese Laid-open Patent Publication No. 2013-8940

In order to transfer heat from a Si substrate which is a main structure of a semiconductor chip of LSI, to a heat dissipation body such as Cu which is used as a heat dissipation material, a metal bonding material called TIM (Thermal Interface Material) is used as a bonding sheet. As a material of the bonding sheet, In or solder is used. In and solder have a thermal conductivity of around 50 Wm·K), which is lower than 168 of Si and 398 of Cu. Accordingly, thermal resistance is generated at the time of heat dissipation, which is a cause of deterioration of heat dissipation efficiency. CNT having a thermal conductivity of over 1000 has been reported. Methods to use it as the heat dissipation material include a method of mixing CNT with rubber or resin, but thermal conductivity of the mixture is far lower than when CNT is used by itself. Further, in some case, CNTs are directly bonded, but due to a low density of the CNTs, actual thermal conductivity as TIM is about 75, which is little different from those of the conventional materials. In this case, gaps between the CNTs can be filled with conductive resin, but this has problems that orientation of the CNTs becomes disordered or thermal conductivity as a composite structure is low due to a low thermal conductivity of the resin.

SUMMARY

A bonding sheet of an embodiment includes: a sheet-shaped support film; a plurality of carbon nanotubes which stand side by side, with one end of each being connected to a surface of the support film; and a metal which fills gaps each present between adjacent ones of the carbon nanotubes.

A heat dissipation mechanism of an embodiment includes: a heat dissipation body; and a bonding sheet which is bonded to a surface of the heat dissipation body, the bonding sheet including a plurality of carbon nanotubes which stand side by side, with a tip of each being connected to the surface of the heat dissipation body; and a metal which fills gaps each present between adjacent ones of the carbon nanotubes.

A manufacturing method of a bonding sheet of an embodiment includes: forming a plurality of carbon nanotubes which stand side by side from a base substance; forming a sheet-shaped support film which covers upper ends of the carbon nanotubes; and filling gaps each present between adjacent ones of the carbon nanotubes with a metal.

A manufacturing method of a bonding sheet of an embodiment includes: growing pieces of vertical graphene which stand in a direction vertical to a surface of a base substance and are densely superimposed on one another, and subsequently growing a plurality of carbon nanotubes standing side by side whose upper ends are connected to lower ends of the pieces of vertical graphene; and filling gaps each present between adjacent ones of the carbon nanotubes with a metal.

A manufacturing method of a heat dissipation mechanism of an embodiment includes: forming a plurality of carbon nanotubes which stand side by side from a base substance; filling gaps each present between adjacent ones of the carbon nanotubes with a metal in a state where tips of the carbon nanotubes abut on a surface of a heat dissipation body; and heat-treating the carbon nanotubes and the metal.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Various preferred embodiments to which a bonding sheet and a manufacturing method thereof, and a heat dissipation mechanism and a manufacturing method thereof according to the present embodiments are applied will be described in detail with reference to the drawings.

First Embodiment

In this embodiment, the bonding sheet and the manufacturing method thereof, and a semiconductor device to which the bonding sheet is applied will be described.

FIG. 1A to FIG. 2C are schematic sectional views to explain the manufacturing method of the bonding sheet according to the first embodiment, in order of steps.

Figure 4A:
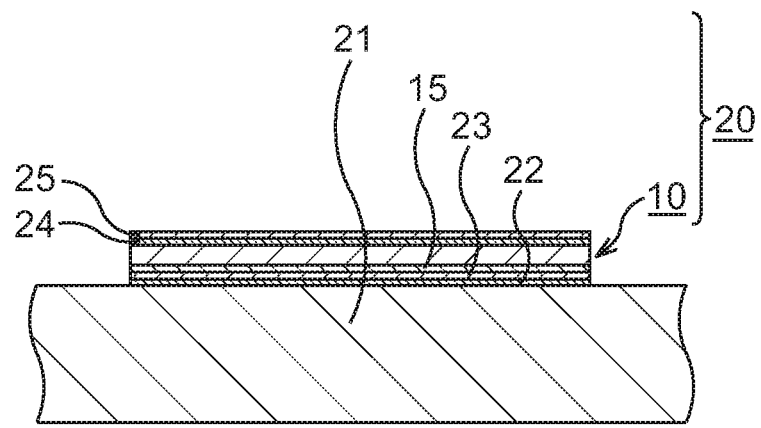
FIG. 4A is a schematic sectional view to explain a manufacturing method of a semiconductor device to which the bonding sheet according to the first embodiment is applied, in order of steps.
Figure 4B:
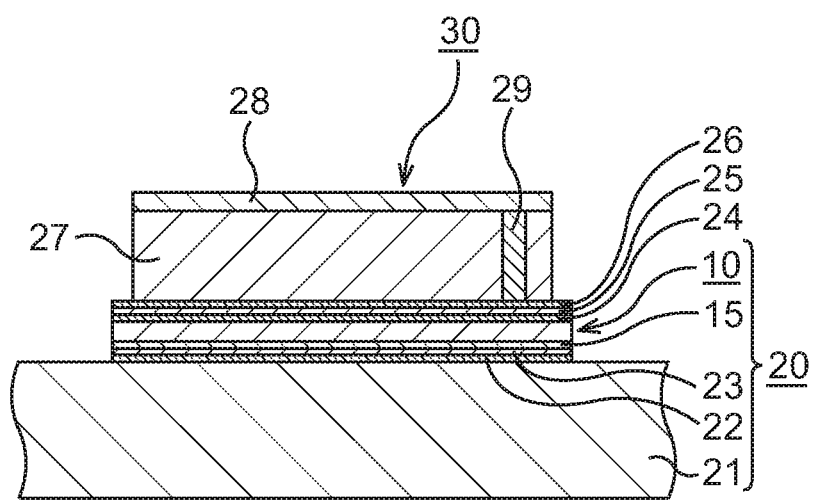
FIG. 4B is a schematic sectional view to explain the manufacturing method of the semiconductor device to which the bonding sheet according to the first embodiment is applied, in order of steps.
Figure 5:
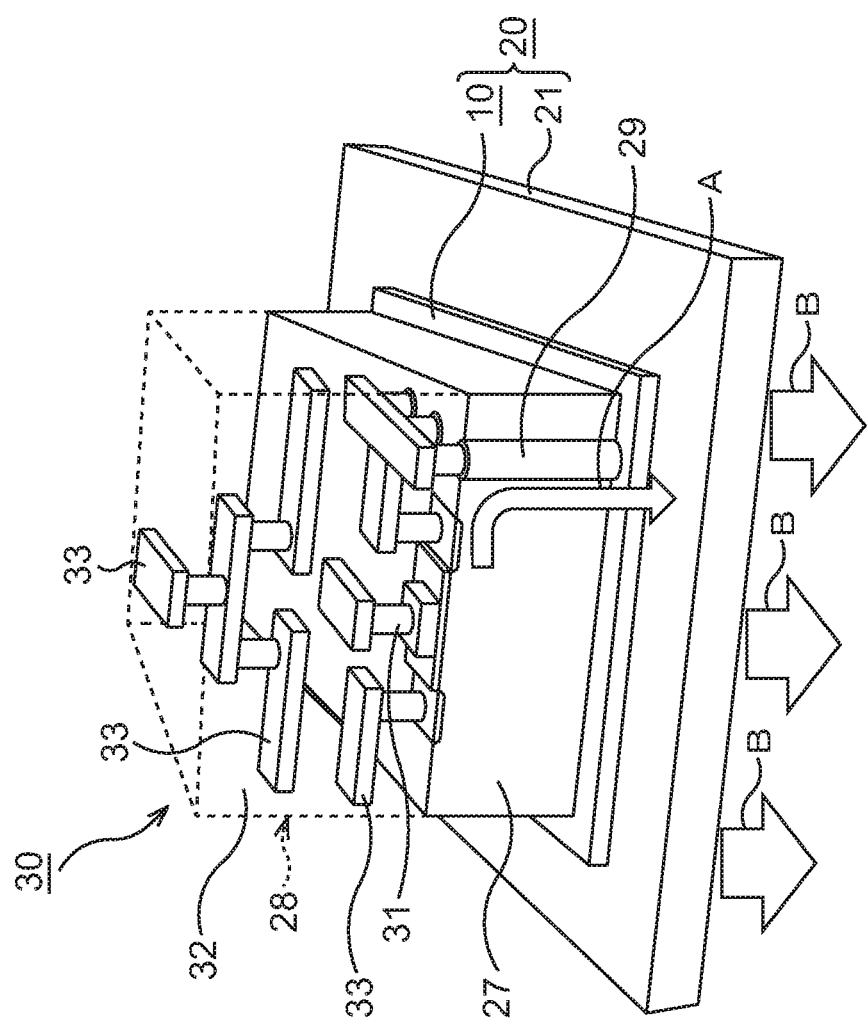
FIG. 5 is a perspective view illustrating a schematic structure of the semiconductor device corresponding to FIG. 4B.

FIG. 4A and FIG. 4B are schematic sectional views to explain a manufacturing method of the semiconductor device to which the bonding sheet according to the first embodiment is applied, in order of steps, and FIG. 5 is a perspective view illustrating a schematic structure of the semiconductor device corresponding to FIG. 4B.

—Bonding Sheet and Manufacturing Method Thereof—

First, the structure of the bonding sheet according to this embodiment will be described together with the manufacturing method thereof.

Figure 1A:
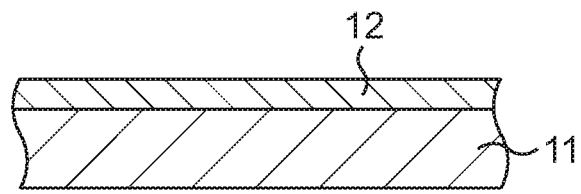
FIG. 1A is a schematic sectional view to explain a manufacturing method of a bonding sheet according to a first embodiment, in order of steps.

As illustrated in FIG. 1A, a silicon oxide film 12 is formed on a base substance 11.

As the base substance 11, a Si substrate is prepared, for instance. A SiC substrate, any of various insulating substrates, or the like may be used instead of the Si substrate.

The silicon oxide film 12, for example, is formed on the base substance 11 by a CVD method or the like.

Figure 1B:
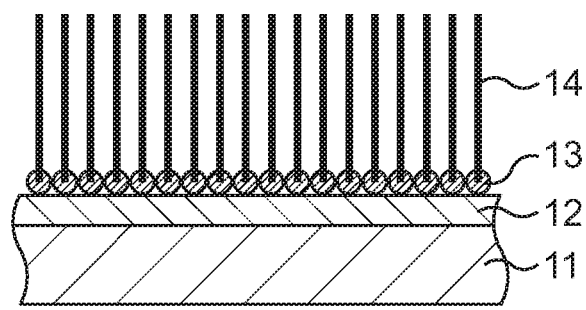
FIG. 1B, which continues from FIG. 1A, is a schematic sectional view to explain the manufacturing method of the bonding sheet according to the first embodiment, in order of steps.

Subsequently, as illustrated in FIG. 1B, carbon nanotubes (CNTs) 14 are grown on the silicon oxide film 12.

In detail, a catalytic material is first deposited on the silicon oxide film 12 to, for example, an about few nm thickness by a vacuum deposition method or the like. As the catalytic material, one kind or two kinds or more of materials selected from Co, Ni, Fe, Al, and the like, or a mixed material of one kind or two kinds or more of these and one kind or two kinds or more selected from Ti, TiN, $TiO_2$, V, and the like is used. For example, Co/Ti or Co/V is selected. Consequently, catalysts 13 are formed on the silicon oxide film 12.

Next, a CNT growth process is executed by, for example, a thermal CVD method while a growth temperature is set equal to or lower than sublimation temperatures of the substrate material and the catalytic material, here, set to about 800° C., for instance. Consequently, the plural CNTs 14 are formed side by side so as to stand from the catalysts 13 present on the silicon oxide film 12.

Figure 1C:
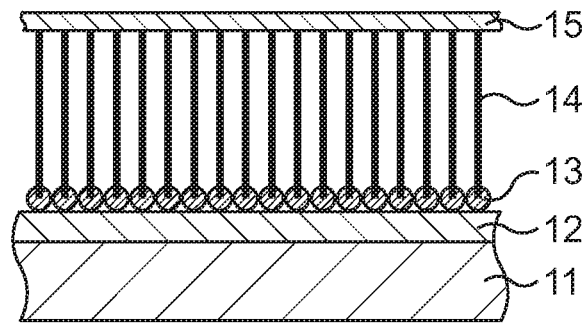
FIG. 1C, which continues from FIG. 1B, is a schematic sectional view to explain the manufacturing method of the bonding sheet according to the first embodiment, in order of steps.

Subsequently, as illustrated in FIG. 1C, a support film 15 is formed on upper ends of the CNTs 14.

In detail, a conductive material such as Au or an Au—Sn alloy, here Au, is deposited on the upper ends of the CNTs 14 by, for example, a vapor deposition method. Consequently, the support film 15 connected to the upper ends of the CNTs 14 is formed on the CNTs 14.

Subsequently, as Illustrated in FIG. 1D to FIG. 2B, a CNT-metal composite structure is formed.

In this embodiment, as fine metal particles 16, fine particles (about 10 nm diameter) of a conductive material having a high thermal conductivity, for example, one kind selected from Cu, Ag, Au, In, solder, and the like, for example, Cu, are used. The fine metal particles 16 are dispersed in an organic solvent such as toluene or xylene to prepare a solution. This solution is supplied to the CNTs 14 by dropping, spin coating, or immersion. In this embodiment, a case where, for example, the immersion is performed is exemplified.

Figure 1D:
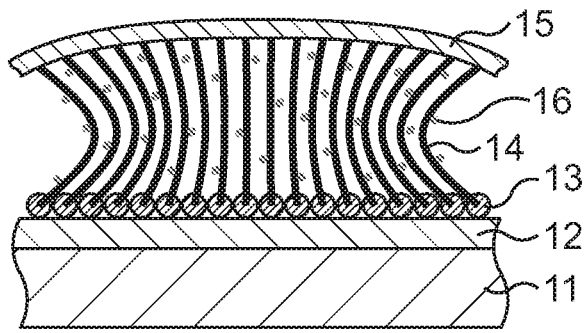
FIG. 1D, which continues from FIG. 1C, is a schematic sectional view to explain the manufacturing method of the bonding sheet according to the first embodiment, in order of steps.

First, as illustrated in FIG. 1D, the base substance 11 on which the CNTs 14 and the support film 15 are formed is immersed (first immersion) in a solution tank having the aforesaid solution. By the immersion, the solution infiltrates into gaps between the adjacent CNTs 14. After the base substance 11 is taken out of the solution tank, the base substance 11 is dried. At this time, due to the evaporation of the organic solvent, the CNTs 14 try to come into close contact with one another to approach one another. However, in this embodiment, since the CNTs 14 are fixedly connected to the silicon oxide film 12 of the base substance 11 at their lower ends and to the support film 15 at their upper ends, they are apart from one another without the occurrence of the close contact of the adjacent CNTs 14. Accordingly, the fine metal particles 16 enter the gaps between the adjacent CNTs 14, and the fine metal particles 16 adhere to the plural CNTs 14 uniformly as a whole.

Figure 2A:
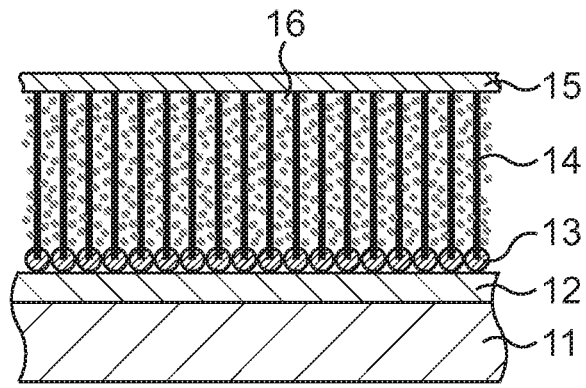
FIG. 2A, which continues from FIG. 1D, is a schematic sectional view to explain the manufacturing method of the bonding sheet according to the first embodiment, in order of steps.

Next, as illustrated in FIG. 2A, the base substance 11 on which the CNTs 14 and the support film 15 are formed is immersed (second immersion) again in the aforesaid solution tank. By the immersion, the solution infiltrates into the gaps between the adjacent CNTs 14, so that the CNTs 14 which are distorted with their center portions approaching one another due to the drying of the base substance 11 return to the original standing state. After the base substance 11 is taken out of the solution tank, the base substance 11 is dried. At this time, even when the organic solvent evaporates, the approach between the CNTs 14 is suppressed and the CNTs 14 are kept substantially upright since the fine metal particles 16 fill the gaps between the adjacent CNTs 14 with a higher density than at the time of the first immersion. The fine metal particles 16 distribute on the plural CNTs 14 uniformly as a whole with a higher density than at the time of the first immersion.

Figure 2B:
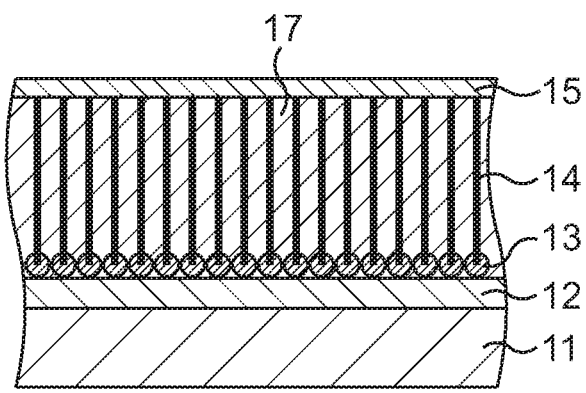
FIG. 2B, which continues from FIG. 2A, is a schematic sectional view to explain the manufacturing method of the bonding sheet according to the first embodiment, in order of steps.

Next, as illustrated in FIG. 2B, the base substance 11 on which the CNTs 14 and the support film 15 are formed is immersed (third immersion) again in the aforesaid solution tank. By the immersion, the solution infiltrates into the gaps between the adjacent CNTs 14. After the base substance 11 is taken out of the solution tank, the base substance 11 is dried. At this time, the fine metal particles 16 fill up areas between the adjacent CNTs 14 with almost no space therebetween, and the gaps between the CNTs 14 are filled with the fine metal particles 16, so that a filler metal 17 of Cu is formed. Through the above, the CNT-metal composite structure in which the gaps between the CNTs 14 are filled with the filler metal 17 is formed.

Incidentally, though the case where the CNT-metal composite structure is formed by performing the immersion three times is exemplified in this embodiment, there may be a case where the CNT-metal composite structure is formed by performing the immersion, for example, twice, or a case where the CNT-metal composite structure is formed by performing the immersion a predetermined number of times equal to or more than four times, depending on a difference in the kind and concentration of the fine particles in the solution, an immersion condition, and so on.

Figure 2C:
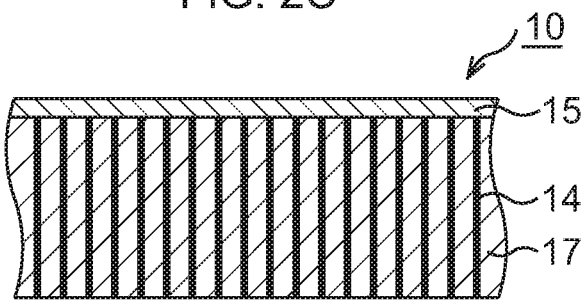
FIG. 2C, which continues from FIG. 2B, is a schematic sectional view to explain the manufacturing method of the bonding sheet according to the first embodiment, in order of steps.

Subsequently, as illustrated in FIG. 2C, the base substance 11 and the catalysts 13 are removed.

In detail, the silicon oxide film 12 is first separated from the catalysts 13 on which the CNTs 14 are formed, by using buffered hydrofluoric acid (BHF). Consequently, the base substance 11 is removed together with the silicon oxide film 12.

Next, the catalysts 13 are processed by using a $FeCl_3$ aqueous solution or a chemical solution of HCl or the like. Consequently, the catalysts 13 are removed from the CNTs 14.

Through the above, the bonding sheet including the CNT-metal composite structure on whose one end surface the sheet-shaped support film 15 is formed and which is composed of the CNTs 14 and the filler metal 17 is formed. The bonding sheet functions as TIM when a semiconductor chip is bonded to a heat dissipation body such as Cu.

In the bonding sheet according to this embodiment, the CNT-metal composite structure composed of the CNTs 14 and the filler metal 17 has a very high thermal conductivity of, for example, about 100 W/(m·K). Therefore, when the bonding sheet is used as TIM, excellent heat dissipation of the semiconductor chip or the like is realized without any deterioration of heat dissipation efficiency of the heat dissipation body such as Cu.

Figure 3A:
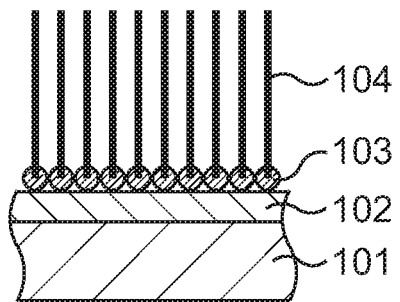
FIG. 3A is a schematic sectional view to explain a problem in the fabrication of a bonding sheet according to a comparative example of the first embodiment.
Figure 3B:
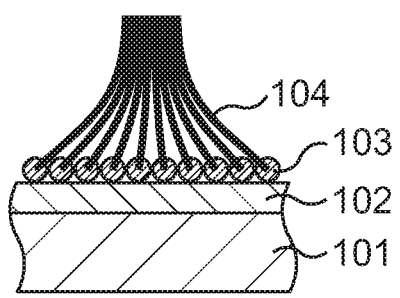
FIG. 3B is a schematic sectional view to explain the problem in the fabrication of the bonding sheet according to the comparative example of the first embodiment.

Here, a comparative example of this embodiment is illustrated in FIG. 3A and FIG. 3B.

In the comparative example, various steps similar to those in FIG. 1A to FIG. 1C of this embodiment are first performed. Consequently, a catalytic material 103 such as Co is formed on a silicon oxide film 102 present on a base substance 101 such as a Si substrate. A plurality of CNTs 104 are formed side by side from this catalytic material 103.

Subsequently, in order to form a CNT-metal composite structure, the base substance 101 on which the CNTs 104 are formed is immersed in a solution tank having a solution similar to that of this embodiment, as in FIG. 2B of this embodiment. After the base substance 101 is taken out of the solution tank, the base substance 101 is dried. At this time, since upper ends of the CNTs 104 are not fixed, the CNTs 104 approach one another to come into close contact with one another due to the evaporation of an organic solvent, to become into a bundle (bundled). At this time, fine metal particles cannot enter the bundled portion of the CNTs 104, and the fine metal particles 16 adhere to the plural CNTs 104 while locally present only near lower ends of the CNTs 104. In this case, even the re-immersion in the solution tank does not eliminate the restriction by the bundling, so that the CNT-metal composite structure is formed in a non-uniform state in which the fine metal particles 16 distribute unevenly only near the lower ends of the CNTs 104.

In the comparative example, since the CNT-metal composite structure is formed in the non-uniform state in which the metal (Cu) distributes unevenly, thermal conductivity deteriorates as a whole.

On the other hand, in this embodiment, in the CNA-metal composite structure composed of the CNTs 14 and the filler metal 17, the metal (Cu) fills the gaps between the CNTs 14 to uniformly distribute as a whole as described above. This realizes a very high thermal conductivity.

As described above, according to this embodiment, the highly reliable bonding sheet very excellent in heat dissipation efficiency is realized.

—Semiconductor Device and Manufacturing Method Thereof—

Next, the structure of the semiconductor device using the above-described bonding sheet will be described together with the manufacturing method thereof. Here, the bonding sheet fabricated in this embodiment is referred to as a bonding sheet 10.

As illustrated in FIG. 4A, the bonding sheet 10 is bonded to a heat dissipation body 21.

As the heat dissipation body 21, a heat sink of, for example, Cu is prepared. A layer 22 of a conductive material such as Au or an AuSn alloy, here, Au, is formed on a surface of the heat dissipation body 21 by, for example, a vapor deposition method.

An In layer 23, for instance, is mounted on the Au layer 22, and the bonding sheet 10 fabricated as described above is disposed, with the support film 15 abutting on the In layer 23 so as to face the In layer 23. By performing heat treatment at, for example, about 200° C. in this state, the bonding sheet 10 is bonded to the surface of the heat dissipation body 21, whereby a heat dissipation mechanism 20 is structured.

Next, a layer 24 of a conductive material such as Au or an Au—Sn alloy, here, Au, is formed on the bonding sheet 10 by, for example, a vapor deposition method. For example, an In layer 25 is mounted on this Au layer 24.

Subsequently, as illustrated in FIG. 4B and FIG. 5, a semiconductor chip 30 is bonded to the bonding sheet 10. Incidentally, in consideration of easier view of the drawing, the illustration of the support film 15, the Au layers 22, 24, 26, and the In layers 23, 25 is omitted in FIG. 5.

The semiconductor chip 30 is prepared. In the semiconductor chip 30, an element layer 23 is formed on a Si substrate 27. In the element layer 28, various functional elements such as, for example, MIS transistors 31 are formed, and in an upper layer thereof, wiring structures 33 connected to the MIS transistors 31 are formed in an interlayer insulating film 32. In the Si substrate 27, through vias 29 for heat dissipation penetrating through the Si substrate 27 are formed.

On a rear surface of the semiconductor chip 30, a layer 26 of a conductive material such as Au or an Au—Sn alloy, here, Au, is formed by, for example, a vapor deposition method. The Au layer 26 formed on the semiconductor chip 30 is disposed so as to abut on the In layer 23. By performing heat treatment at, for example, about 200° C. in this state, the semiconductor chip 30 is bonded to the top of the bonding sheet 10. Through the above, the semiconductor device according to this embodiment in which the semiconductor chip 30 is bonded to the heat dissipation mechanism 20 is formed.

In the semiconductor device according to this embodiment, the through vias 29 for heat dissipation connect the wiring structures 33 in the element layer 28 and the bonding sheet 10, so that heat generated in the element layer 28 is dissipated to the bonding sheet 10 and the heat dissipation body 21 via the through vias 29 for heat dissipation. In this embodiment, the bonding sheet 10 being TIM for bonding the semiconductor chip 30 to the heat dissipation body 21 has a very high thermal conductivity. Therefore, excellent heat dissipation of the semiconductor chip 30 is realized without any deterioration of heat dissipation efficiency of the heat dissipation body 21.

As described above, according to this embodiment, the semiconductor device with a high heat dissipating property, that includes the highly reliable bonding sheet very excellent in heat dissipation efficiency is realized.

Modification Example

Hereinafter, a modification example of the first embodiment will be described. Similarly to the first embodiment, this example discloses a bonding sheet and a manufacturing method thereof and a semiconductor device to which the bonding sheet is applied, but this example is different in the structure of the bonding sheet.

FIG. 6A to FIG. 7D are schematic sectional views to explain the manufacturing method of the bonding sheet according to the modification example of the first embodiment, in order of steps.

Figure 8A:
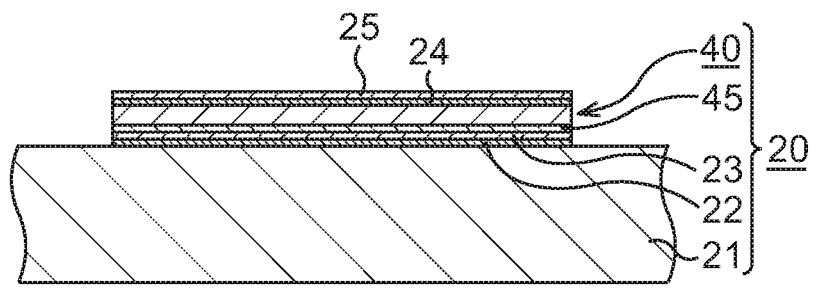
FIG. 8A is a schematic sectional view to explain a manufacturing method of a semiconductor device to which the bonding sheet according to the modification example of the first embodiment is applied, in order of steps.
Figure 8B:
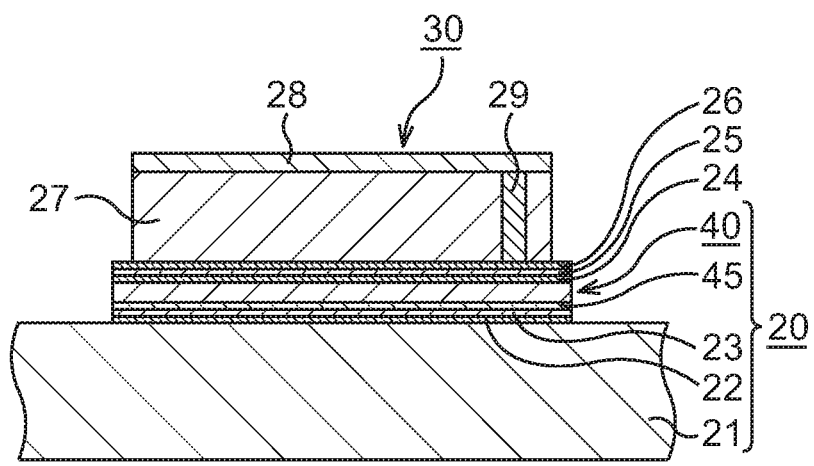
FIG. 8B, which continues from FIG. 8A, is a schematic sectional view to explain the manufacturing method of the semiconductor device to which the bonding sheet according to the modification example of the first embodiment is applied, in order of steps.
Figure 9:
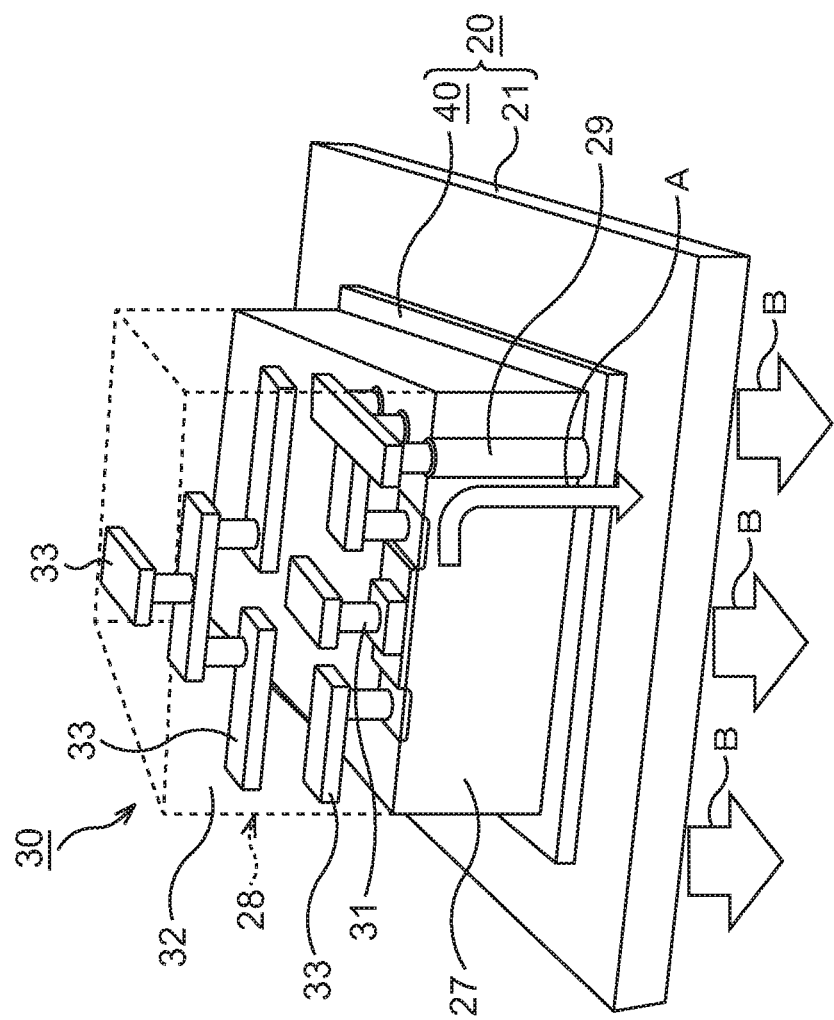
FIG. 9 is a perspective view illustrating a schematic structure of the semiconductor device corresponding to FIG. 8B.

FIG. 8A and FIG. 8B are schematic sectional views to explain the manufacturing method of the semiconductor device to which the bonding sheet according to the modification example of the first embodiment is applied, in order of steps, and FIG. 9 is a perspective view illustrating a schematic structure of the semiconductor device corresponding to FIG. 8B.

Figure 6A:
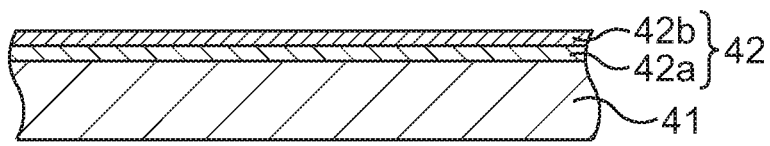
FIG. 6A is a schematic sectional view to explain a manufacturing method of a bonding sheet according to a modification example of the first embodiment, in order of steps.

First, as illustrated in FIG. 6A, a foundation 42 is formed on a base substance 41.

As the base substance 41, a Si substrate is prepared, for instance. A SiC substrate, any of various insulating substrates, or the like may be used instead of the Si substrate.

The base substance 41 is carried to a deposition chamber of a vacuum process system. In the deposition chamber, a first layer 42a and a second layer 42b are sequentially stacked on the base substance 41 by a vacuum deposition method, a sputtering method, an ALD (Atomic Layer Deposition) method, or the like.

The first layer 42a is made of at least one kind selected from titanium (Ti), titanium nitride (TiN), titanium oxide ($TiO_2$), niobium (Nb), and vanadium (V), and is formed in a film form. For example, Ti is deposited to an about 0.5 nm to about 1.5 nm thickness, so that the first layer 42a is formed. The first layer 42a has an adhesive function between the second layer 42b and the base substance 41.

The second layer 42b is made of at least one kind selected from cobalt (Co), nickel (Ni), and iron (Fe), and comes to have a film shape after its formation. For example, Co is deposited to an about 2 nm to about 5 nm thickness, so that the second layer 42b is formed. The second layer 42b has a direct catalytic function for graphene growth.

Subsequently, an integrated structure of a support film, which includes lateral-direction graphene and longitudinal-direction graphene, and CNTs is continuously formed.

In detail, the base substance 41 is carried to a CVD chamber. Source gas is introduced into the CVD chamber. As the source gas, acetylene ($C_2H_2$) gas is used. A flow rate of the $C_2H_2$ gas is set to about 50 sccm. A growth temperature (environmental temperature in the CVD chamber 104) is set to a value within a low-temperature range of 400° C. to 450° C., here, set to about 450° C., and the temperature is increased to 450° C.

Figure 6B:
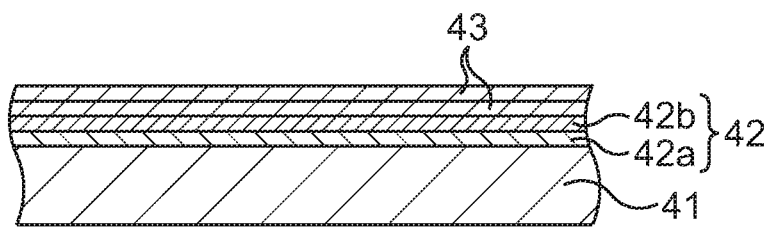
FIG. 6B, which continues from FIG. 6A, is a schematic sectional view to explain the manufacturing method of the bonding sheet according to the modification example of the first embodiment, in order of steps.

The graphene grows in a horizontal direction (lateral direction) to the surface of the base substance 41 by using the Co film of the second layer 42b as a catalyst. This graphene will be referred to as lateral-direction graphene 43. The lateral-direction graphene 43 is stacked in one layer or a plurality of layers. A state at this time is illustrated in FIG. 6B.

Figure 6C:
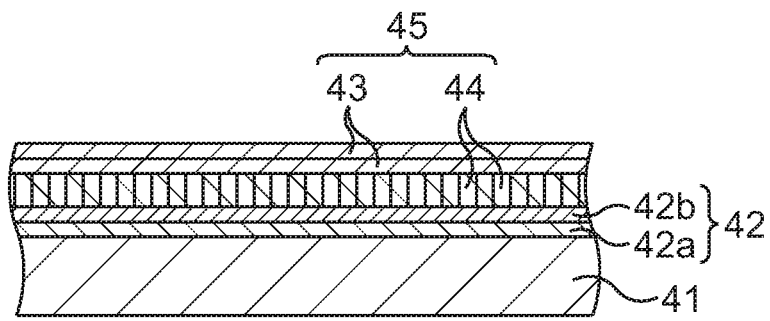
FIG. 6C, which continues from FIG. 6B, is a schematic sectional view to explain the manufacturing method of the bonding sheet according to the modification example of the first embodiment, in order of steps.

As the growth of the lateral-direction graphene 43 progresses, the Co film of the second layer 42b aggregates to become particulate or island-shaped Co. In this case, since Co is in the particulate shape or in the island shape, the graphene grows in a vertical direction (longitudinal direction) to the surface of the base substance 41. This graphene will be referred to as longitudinal-direction graphene 44. The longitudinal-direction graphene 44 is formed integrally with the lateral-direction graphene 43 by being connected to the lateral-direction graphene 43 at its upper end, and is stacked in a plurality of layers which stand in the vertical direction and are densely superimposed on one another. A state at this time is illustrated in FIG. 6C.

Figure 6D:
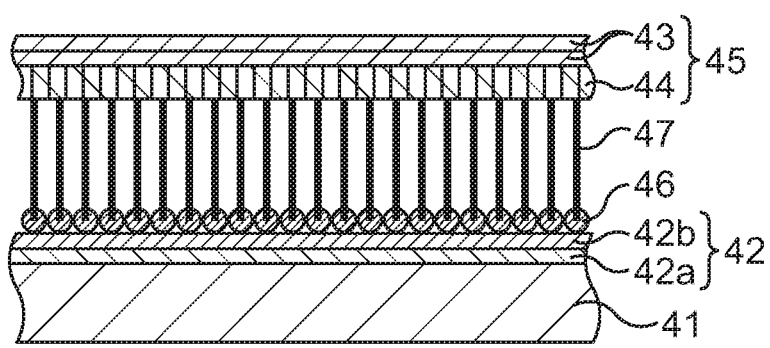
FIG. 6D, which continues from FIG. 6C, is a schematic sectional view to explain the manufacturing method of the bonding sheet according to the modification example of the first embodiment, in order of steps.

Subsequently, while the introduction of the source gas is continued, the growth temperature (environmental temperature in the CVD chamber 104) is set to a value within a high-temperature range of 250° C. to 1000° C., here set to about 800° C., and the temperature is gradually increased from 450° C. up to 800° C. At this time, the aggregation of the particulate or island-shaped Co of the second layer 42b further progresses, so that. Co of the second layer 42b starts to become fine particles (those that have become fine are illustrated as catalysts 46 in FIG. 6D), and CNTs 47 grow in the vertical direction (longitudinal direction) to the surface of the silicon base substance 41. The CNTs 47 are formed integrally, with their upper ends being connected to lower ends of the pieces of longitudinal-direction graphene 44, and the plural CNTs 47 densely stand in the vertical direction. A state at this time is illustrated in FIG. 6D. It is possible to change the thickness of the CNTs 47 by changing a temperature increase rate (temperature gradient) when the temperature is increased from 450° C. to 800° C. Setting the temperature gradient gentle makes the CNTs 47 have a large diameter. On the other hand, setting the temperature gradient steep makes the CNTs 47 have a small diameter.

In the above-described manner, the integrated structure of the support film 45, which is composed of the lateral-direction graphene 43 and the longitudinal-direction graphene 44, and the CNTs 47 is formed. It has been confirmed that, in this integrated structure, the plural pieces of longitudinal-direction graphene 44 are formed very densely under the lateral-direction graphene 43, and the CNTs 47 are formed very densely under the longitudinal-direction graphene 44.

Figure 7A:
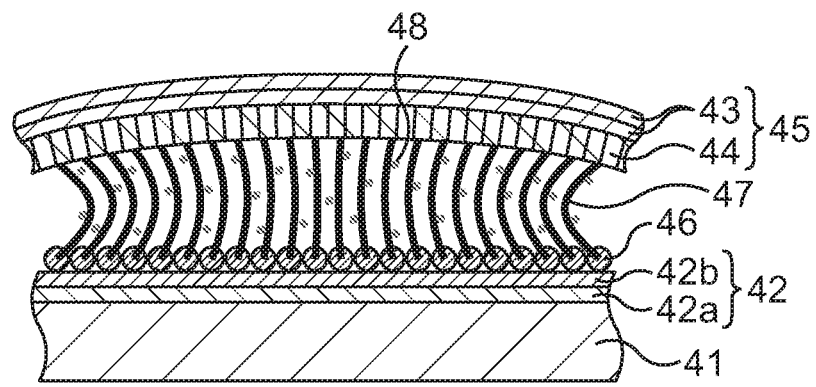
FIG. 7A, which continues from FIG. 6D, is a schematic sectional view to explain the manufacturing method of the bonding sheet according to the modification example of the first embodiment, in order of steps.
Figure 7B:
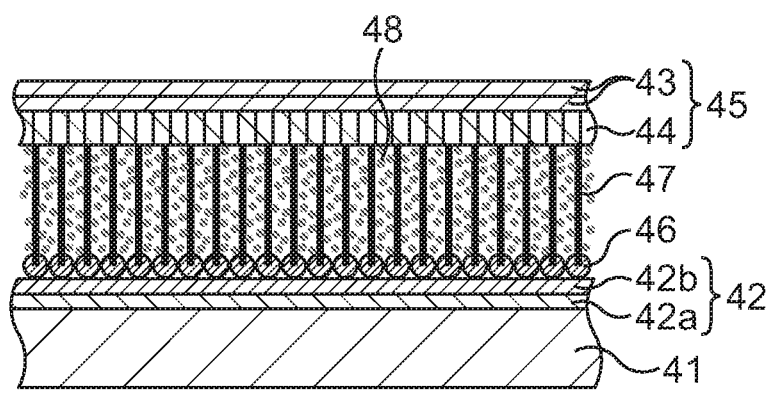
FIG. 7B, which continues from FIG. 7A, is a schematic sectional view to explain the manufacturing method of the bonding sheet according to the modification example of the first embodiment, in order of steps.
Figure 7C:
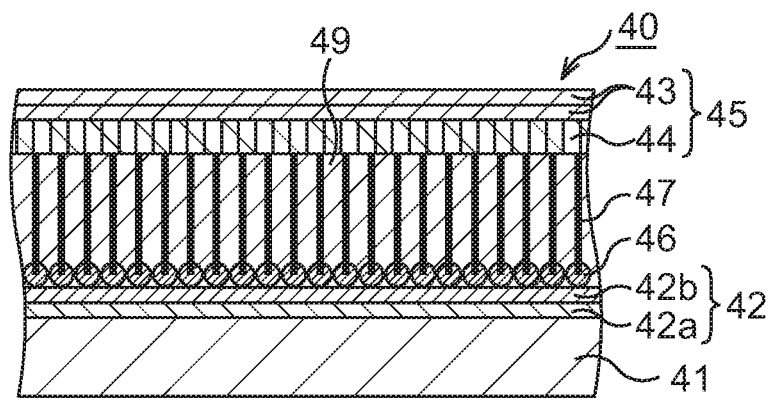
FIG. 7C, which continues from FIG. 7B, is a schematic sectional view to explain the manufacturing method of the bonding sheet according to the modification example of the first embodiment, in order of steps.

Subsequently, as illustrated in FIG. 7A to FIG. 7C, a CNT-metal composite structure is formed.

In this example, as fine metal particles 43, fine particles (about 10 nm diameter) of a conductive material high in thermal conductivity, for example, one kind selected from Cu, Ag, Au, In, solder, and the like, for example, Cu are used. The fine metal particles 48 are dispersed in an organic solvent such as toluene or xylene to prepare a solution. This solution is supplied to the CNTs 47 by dropping, spin coating, or immersion. In this example, a case where, for example, the immersion is performed is exemplified.

First, as illustrated in FIG. 7A, the base substance 41 on which the CNTs 47 and the support film 45 are formed is immersed (first immersion) in a solution tank having the aforesaid solution. By the immersion, the solution infiltrates into gaps between the adjacent CNTs 47. After the base substance 41 is taken out of the solution tank, the base substance 41 is dried. At this time, due to the evaporation of the organic solvent, the CNTs 47 try to come into close contact with one another to approach one another. However, in this example, since the CNTs 47 are fixedly connected to the foundation 42 of the base substance 41 at their lower ends and to the support film 45 at their upper ends, they are apart from one another without the occurrence of the close contact of the adjacent CNTs 47. Accordingly, the fine metal particles 48 enter the gaps between the adjacent CNTs 47, and the fine metal particles 48 adhere to the plural CNTs 47 uniformly as a whole.

Next, as illustrated in FIG. 7B, the base substance 41 on which the CNTs 47 and the support film 45 are formed is immersed (second immersion) again in the aforesaid solution tank. By the immersion, the solution infiltrates into the gaps between the adjacent CNTs 47, so that the CNTs 47 which are distorted with their center portions approaching one another due to the drying of the base substance 41 return to the original standing state. After the base substance 41 is taken out of the solution tank, the base substance 41 is dried. At this time, even when the organic solvent evaporates, the approach between the CNTs 47 is suppressed and the CNTs 47 are kept substantially upright since the fine metal particles 48 fill the gaps between the CNTs 47 with a higher density than at the time of the first immersion. The fine metal particles 48 distribute on the plural CNTs 47 uniformly as a whole with a higher density than at the time of the first immersion.

Next, as illustrated in FIG. 7C, the base substance 41 on which the CNTs 47 and the support film 45 are formed is immersed (third immersion) again in the aforesaid solution tank. By the immersion, the solution infiltrates into the gaps between the adjacent CNTs 47. After the base substance 41 is taken out of the solution tank, the base substance 41 is dried. At this time, the fine metal particles 48 fill up areas between the adjacent CNTs 47 with almost no space therebetween, and the gaps between the CNTs 47 are filled with the fine metal particles 48, so that a filler metal 49 of Cu is formed. Through the above, the CNT-metal composite structure in which the gaps between the CNTs 47 are filled with the filler metal 49 is formed.

Incidentally, though the case where the CNT-metal composite structure is formed by performing the immersion three times is exemplified in this example, there may be a case where the CNT-metal composite structure is formed by performing the immersion, for example, twice, or a case where the CNT-metal composite structure is formed by performing the immersion a predetermined number of times equal to or more than four times, depending on a difference in the kind and concentration of the fine particles in the solution, an immersion condition, and so on.

Figure 7D:
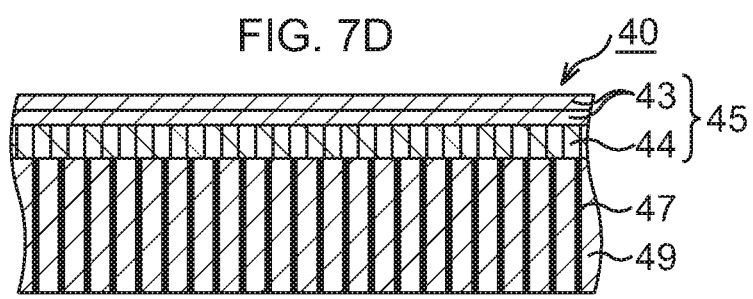
FIG. 7D, which continues from FIG. 7C, is a schematic sectional view to explain the manufacturing method of the bonding sheet according to the modification example of the first embodiment, in order of steps.

Subsequently, as illustrated in FIG. 7D, the base substance 41, and the foundation 42 and the catalysts 46 are removed.

In detail, the base substance 41 is first separated from she foundation 42 by using buffered hydrofluoric acid (BHF). Consequently, the base substance 41 is removed.

Next, the foundation 42 and the catalysts 46 are processed by using a $FeCl_3$ aqueous solution or a chemical solution of HCl or the like. Consequently, the foundation 42 and the catalysts 46 are removed from the CNTs 47.

Through the above, the bonding sheet including the CNT-metal composite structure on whose one end surface the sheet-shaped support film 45 is formed and which is composed of the CNTs 47 and the filler metal 49 is formed. The bonding sheet functions as TIM when a semiconductor chip is bonded to a heat dissipation body such as Cu.

In the bonding sheet according to this example, the integrated structure of the support film 45, which is composed of the lateral-direction graphene 43 and the longitudinal-direction graphene 44, and the CNTs 47 is formed with a very high density, and the CNT-metal composite structure composed of the CNTs 47 and the filler metal 49 has a very high thermal conductivity of, for example, about 100 W/(m·K). Therefore, when this bonding sheet is used as TIM, excellent heat dissipation of the semiconductor chip or the like is realized without any deterioration of heat dissipation efficiency of the heat dissipation body such as Cu.

—Semiconductor Device and Manufacturing Method Thereof—

Next, the structure of the semiconductor device using the above-described bonding sheet will be described together with the manufacturing method thereof. Here, the bonding sheet fabricated in this example is referred to as a bonding sheet 40.

As illustrated in FIG. 8A, the bonding sheet 40 is bonded to a heat dissipation body 21.

As the heat dissipation body 21, a heat sink of, for example, Cu is prepared. A layer 22 of a conductive material such as Au or an AuSn alloy, here, Au, is formed on a surface of the heat dissipation body 21 by, for example, a vapor deposition method.

An In layer 23, for instance, is mounted on the Au layer 22, and the bonding sheet 40 fabricated as described above is disposed, with the support film 45 abutting on the In layer 23 so as to face the In layer 23. By performing heat treatment at, for example, about 200° C. in this state, the bonding sheet 40 is bonded to the surface of the heat dissipation body 21, whereby a heat dissipation mechanism 20 is structured.

Next, a layer 24 of a conductive material such as Au or an Au—Sn alloy, here, Au, is formed on the bonding sheet 40 by, for example, a vapor deposition method. For example, an In layer 25 is mounted on this Au layer 24.

Subsequently, as illustrated in FIG. 8B and FIG. 9, a semiconductor chip 30 is bonded to the bonding sheet 40. Incidentally, in consideration of easier view of the drawing, the illustration of the support film 45, the Au layers 22, 24, 26, and the In layers 23, 25 is omitted in FIG. 9.

The semiconductor chip 30 is prepared. In the semiconductor chip 30, an element layer 28 is formed on a Si substrate 27. In the element layer 28, various functional elements such as, for example, MIS transistors 31 are formed, and in an upper layer thereof, wiring structures 33 connected to the MIS transistors 31 are formed in an interlayer insulating film 32. In the Si substrate 27, through vias 29 for heat dissipation penetrating through the Si substrate 27 are formed.

On a rear surface of the semiconductor chip 30, a layer 26 of a conductive material such as Au or an Au—Sn alloy, here, Au, is formed by, for example, a vapor deposition method. The Au layer 26 formed on the semiconductor chip 30 is disposed so as to abut on the In layer 25. By performing heat treatment at, for example, about 200° C. in this state, the semiconductor chip 30 is bonded to the top of the bonding sheet 40. Through the above, the semiconductor device according to this example in which the semiconductor chip 30 is bonded to the heat dissipation mechanism 20 is formed.

In the semiconductor device according to this example, the through vias 29 for heat dissipation connect the wiring structures 33 in the element layer 28 and the bonding sheet 40, so that heat generated in the element layer 28 is dissipated to the bonding sheet 40 and the heat dissipation body 21 via the through vias 29 for heat dissipation. In this example, the bonding sheet 40 being TIM for bonding the semiconductor chip 30 and the heat dissipation body 21 has a very high thermal conductivity. Therefore, excellent heat dissipation of the semiconductor chip 30 is realized without any deterioration of heat dissipation efficiency of the heat dissipation body 21.

As described above, according to this example, the semiconductor device with a high heat dissipating property, that includes the highly reliable bonding sheet very excellent in heat dissipation efficiency is realized.

Second Embodiment

In this embodiment, a heat dissipation mechanism and a manufacturing method thereof, and a semiconductor device to which the heat dissipation mechanism is applied will be described.

FIG. 10A to FIG. 11C are schematic sectional views to explain the manufacturing method of the heat dissipation mechanism according to the second embodiment, in order of steps.

Figure 12A:
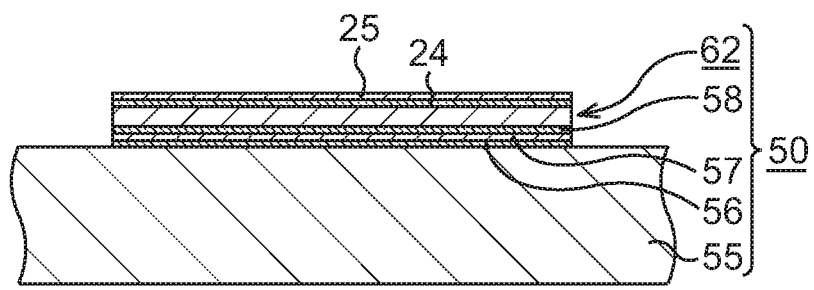
FIG. 12A is a schematic sectional view to explain a manufacturing method of a semiconductor device to which the heat dissipation mechanism according to the second embodiment is applied, in order of steps.
Figure 12B:
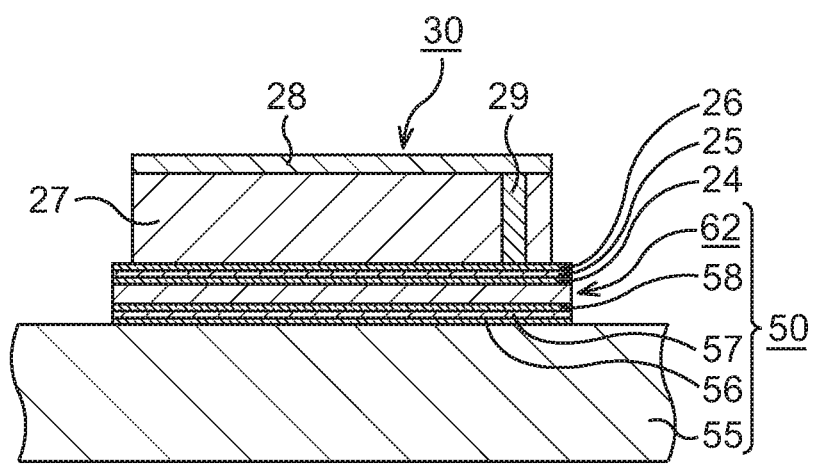
FIG. 12B, which continues from FIG. 12A, is a schematic sectional view to explain the manufacturing method of the semiconductor device to which the heat dissipation mechanism according to the second embodiment is applied, in order of steps.
Figure 13:
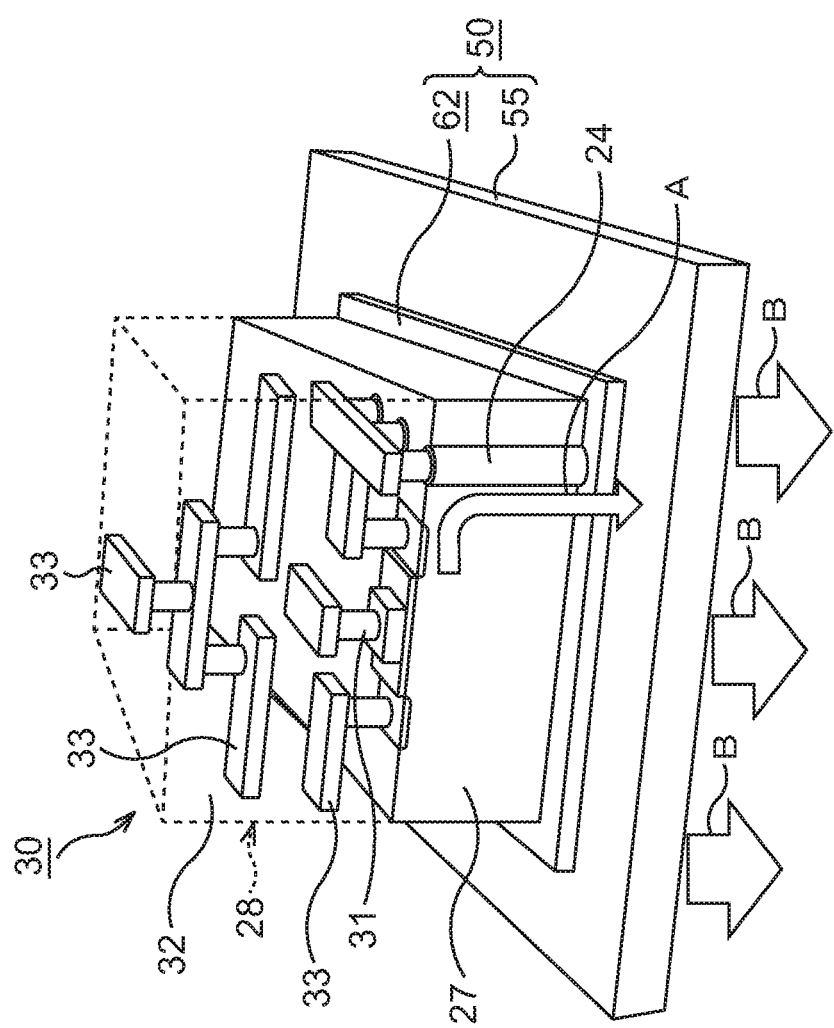
FIG. 13 is a per view illustrating a schematic structure of the semiconductor device corresponding to FIG. 12B.

FIG. 12A and FIG. 12B are schematic sectional views to explain a manufacturing method of the semiconductor device to which the heat dissipation mechanism according to the second embodiment is applied, in order of steps, and FIG. 13 is a perspective view illustrating a schematic structure of the semiconductor device corresponding to FIG. 12B.

—Heat Dissipation Mechanism and Manufacturing Method Thereof—

First, the structure of the heat dissipation mechanism according to this embodiment will be described together with the manufacturing method thereof.

Figure 10A:
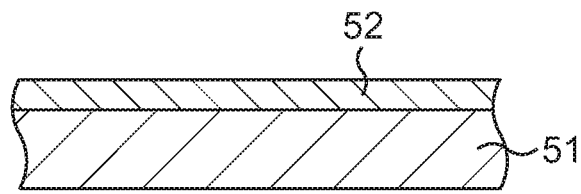
FIG. 10A is a schematic sectional view to explain a manufacturing method of a heat dissipation mechanism according to a second embodiment, in order of steps.

As illustrated in FIG. 10A, a silicon oxide film 52 is formed on a base substance 51.

As the base substance 51, a Si substrate is prepared, for instance. A SiC substrate, any of various insulating substrates, or the like may be used instead of the Si substrate.

The silicon oxide film 52 is formed on the base substance 51 by, for example, a CVD method or the like.

Figure 10B:
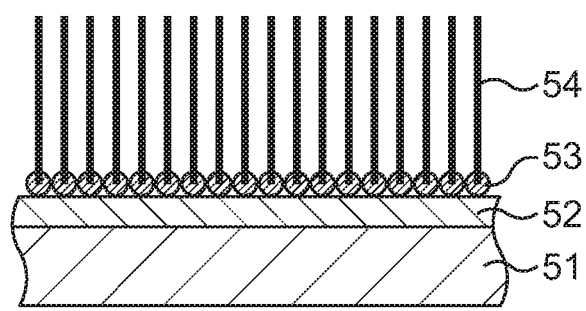
FIG. 10B, which continues from FIG. 10A, is a schematic sectional view to explain the manufacturing method of the heat dissipation mechanism according to the second embodiment, in order of steps.

Subsequently, as illustrated in FIG. 10B, CNTs 54 are grown on the silicon oxide film 52.

In detail, a catalytic material is first deposited on the silicon oxide film 52 to, for example, an about several nm thickness by a vacuum deposition method or the like. As the catalytic material, one kind or two kinds or more of materials selected from Co, Ni, Fe, Al, and the like, or a mixed material of one kind or two kinds or more of these and one kind or two kinds or more selected from Ti, TiN, TiO$_2$, V, and the like is used. For example, Co/Ti or Co/V is selected. Consequently, catalysts 53 are formed on the silicon oxide film 52.

Next, a CNT growth process is executed by, for example, a thermal CVD method while a growth temperature is set equal to or lower than sublimation temperatures of the substrate material and the catalytic material, here, set to about 800° C., for instance. Consequently, the plural CNTs 54 are formed side by side so as to stand from the catalysts 53 present on the silicon oxide film 52.

Figure 10C:
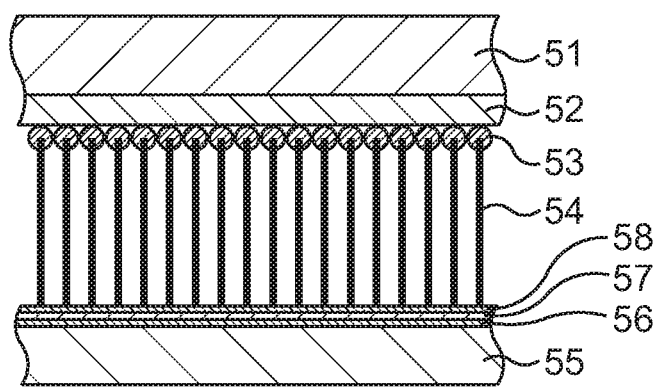
FIG. 10C, which continues from FIG. 10B, is a schematic sectional view to explain the manufacturing method of the heat dissipation mechanism according to the second embodiment, in order of steps.

Subsequently, as illustrated in FIG. 10C, tips of the CNTs 54 are bonded to a heat dissipation body 55.

As the heat dissipation body 55, a heat sink of, for example, Cu is prepared. A layer 56 of a conductive material such as Au or an AuSn alloy, here, Au, is formed on a surface of the heat dissipation body 55 by, for example, a vapor deposition method.

An Au layer 58 is formed on the Au layer 56 via, for example, an In layer 57. Then, the CNTs 54 are disposed, with their tips abutting on the Au layer 58 so as to face the Au layer 58. By performing heat treatment at, for example, about 200° C. in this state, the tips of the CNTs 54 are bonded to the surface of the heat dissipation body 51. Hereinafter, heat dissipation body 51-side tips of the CNTs 54 will be referred to as lower ends, and base substance 51-side tips thereof will be referred to as upper ends.

Subsequently, as illustrated in FIG. 10D to FIG. 11B, a CNT-metal composite structure is formed.

In this embodiment, as fine metal particles 59, fine particles (about 10 nm diameter) of a conductive material high in thermal conductivity, for example, one kind selected from Cu, Ag, Au, In, solder, and the like, for example, Cu are used. The fine metal particles 59 are dispersed in an organic solvent such as toluene or xylene to prepare a solution. This solution is supplied to the CNTs 54 by dropping, spin coating, or immersion. In this embodiment, a case where, for example, the immersion is performed is exemplified.

Figure 10D:
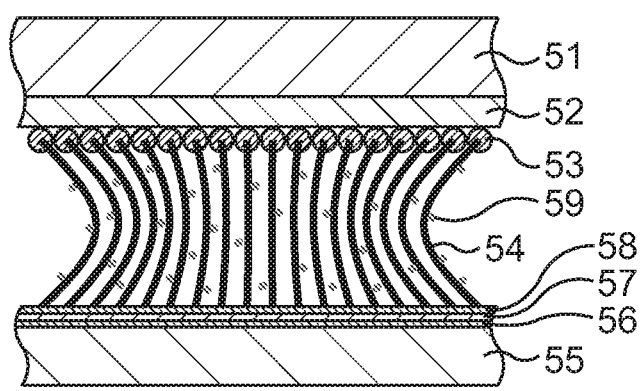
FIG. 10D, which continues from FIG. 10C, is a schematic sectional view to explain the manufacturing method of the heat dissipation mechanism according to the second embodiment, in order of steps.

First, as illustrated in FIG. 10D, the heat dissipation body 55 to which the CNTs 54 are bonded is immersed (first immersion) in a solution tank having the aforesaid solution. By the immersion, the solution infiltrates into gaps between the adjacent CNTs 54. After the heat dissipation body 55 is taken out of the solution tank, the heat dissipation body 55 is dried. At this time, due to the evaporation of the organic solvent, the CNTs 54 try to come into close contact with one another to approach one another. However, in this embodiment, since the CNTs 54 are fixedly connected to the Au layer 58 of the heat dissipation body 55 at their lower ends and to the silicon oxide film 52 of the base substance 51 at their upper ends, they are apart from one another without the occurrence of the close contact between the adjacent CNTs 54. Accordingly, the fine metal particles 59 enter the gaps between the adjacent CNTs 54, and the fine metal particles 59 adhere to the plural CNTs 54 uniformly as a whole.

Figure 11A:
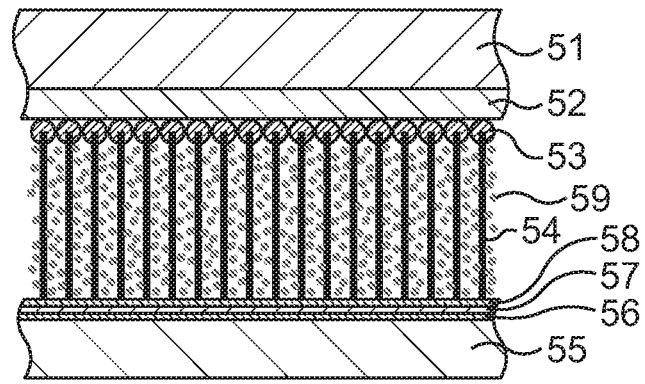
FIG. 11A, which continues from FIG. 10D, is a schematic sectional view to explain the manufacturing method of the heat dissipation mechanism according to the second embodiment, in order of steps.

Next, as illustrated in FIG. 11A, the heat dissipation body 55 to which the CNTs 54 are bonded is immersed (second immersion) again in the aforesaid solution tank. By the immersion, the solution infiltrates into the gaps between the adjacent CNTs 54, so that the CNTs 54 which are distorted with their center portions approaching one another due to the drying of the heat dissipation body 55 return to the original standing state. After the heat dissipation body 55 is taken out of the solution tank, the heat dissipation body 55 is dried. At this time, even when the organic solvent evaporates, the approach between the CNTs 54 is suppressed and the CNTs 54 are kept substantially upright since the fine metal particles 59 fill the gaps between the CNTs 54 with a higher density than at the time of the first immersion. The fine metal particles 59 distribute on the plural CNTs 54 uniformly as a whole with a higher density than at the time of the first immersion.

Figure 11B:
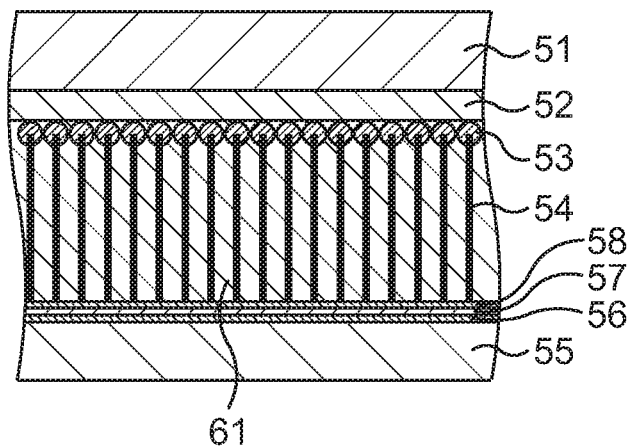
FIG. 11B, which continues from FIG. 11A, is a schematic sectional view to explain the manufacturing method of the heat dissipation mechanism according to the second embodiment, in order of steps.

Next, as illustrated in FIG. 11B, the heat dissipation body 55 to which the CNTs 54 are bonded is immersed (third immersion) again in the aforesaid solution tank. By the immersion, the solution infiltrates into the gaps between the adjacent CNTs 54. After the heat dissipation body 55 is taken out of the solution tank, the heat dissipation body 55 is dried. At this time, the fine metal particles 59 fill up areas between the adjacent CNTs 54 with almost no space therebetween, and the gaps between the CNTs 54 are filled with the fine metal particles 59, so that a filler metal 61 of Cu is formed. Through the above, the CNT-metal composite structure in which the gaps between the CNTs 54 are filled with the filler metal 61 is formed.

Incidentally, though the case where the CNT-metal composite structure is formed by performing the immersion three times is exemplified in this embodiment, there may be a case where the CNT-metal composite structure is formed by performing the immersion, for example, twice, or a case where the CNT-metal composite structure is formed by performing the immersion a predetermined number of times equal to or more than four times, depending on a difference in the kind and concentration of the fine particles in the solution, an immersion condition, and so on.

Figure 11C:
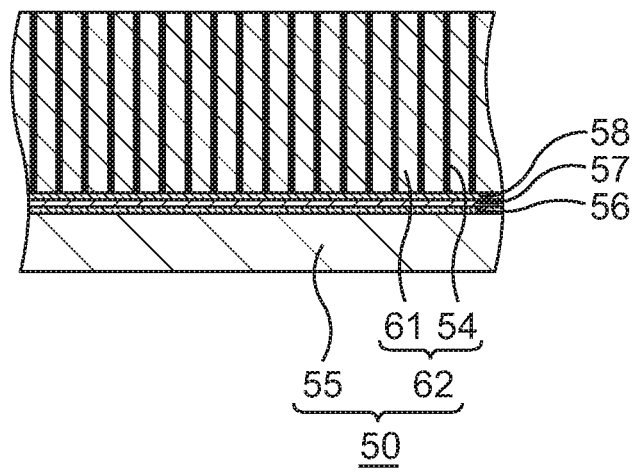
FIG. 11C, which continues from FIG. 11B, is a schematic sectional view to explain the manufacturing method of the heat dissipation mechanism according to the second embodiment, in order of steps.

Subsequently, as illustrated in FIG. 11C, the base substance 51 and the catalysts 53 are removed.

In detail, the silicon oxide film 52 is first separated from the catalysts 53 on which the CNTs 54 are formed, by using buffered hydrofluoric acid (BHF). Consequently, the base substance 51 is removed together with the silicon oxide film 52.

Next, the catalysts 53 are processed by using a FeCl$_3$ aqueous solution, a chemical solution of HCl or the like. Consequently, the catalysts 53 are removed from the CNTs 54.

Through the above, the heat dissipation mechanism 50 including a bonding sheet 62 having the CNT-metal composite structure composed of the CNTs 54 and the filler metal 61 is formed. In the heat dissipation mechanism. 50, the bonding sheet 62 functions as TIM when a semiconductor chip is bonded.

In the heat dissipation mechanism 50 according to this embodiment, the CNT-metal composite structure composed of the CNTs 54 and the filler metal 61 has a very high thermal conductivity of, for example, about 100 W/(m·K). Therefore, when this CNT-metal composite structure is used in TIM, excellent heat dissipation of the semiconductor chip or the like is realized without any deterioration of heat dissipation efficiency of the heat dissipation mechanism 50.

—Semiconductor Device and Manufacturing Method Thereof—

Next, the structure of the semiconductor device using the above-described heat dissipation mechanism will be described together with the manufacturing method thereof.

As illustrated in FIG. 12A, an Au layer 24 and an In layer 25 are formed on the heat dissipation mechanism 50.

In detail, on the bonding sheet 62 of the heat dissipation mechanism 50, the layer 24 of a conductive material such as Au or an Au—Sn alloy, here, Au, is formed by, for example, a vapor deposition method. On this Au layer 24, the In layer 25, for example, is mounted.

Subsequently, as Illustrated in FIG. 12B and FIG. 13, a semiconductor chip 30 is bonded to the heat dissipation mechanism 50. Incidentally, in consideration of easier view of the drawing, the illustration of the Au layers, 56, 58, 24, 26 and the In layers 57, 25 is omitted in FIG. 13.

The semiconductor chip 30 is prepared. In the semiconductor chip 30, an element layer 28 is formed on a Si substrate 27. In the element layer 28, various functional elements such as, for example, MIS transistors 31 are formed, and in an upper layer thereof, wiring structures 33 connected to the MIS transistors 31 are formed in an interlayer insulating film 32. In the Si substrate 27, through vias 29 for heat dissipation penetrating through the Si substrate 27 are formed.

On a rear surface of the semiconductor chip 30, a layer 26 of a conductive material such as Au or an Au—Sn alloy, here, Au, is formed by, for example, a vapor deposition method. The Au layer 26 formed on the semiconductor chip 30 is disposed so as to abut on the In layer 25. By performing heat treatment at, for example, about 200° C. in this state, the semiconductor chip 30 is bonded to the top of the bonding sheet 62. Through the above, the semiconductor device according to this embodiment in which the semiconductor chip 30 is bonded to the heat dissipation mechanism 50 is formed.

In the semiconductor device according to this embodiment, the through vias 29 for heat dissipation connect the wiring structures 33 in the element layer 28 and the bonding sheet 62, so that heat generated in the element layer 28 is dissipated to the bonding sheet 62 and the heat dissipation body 55 via the through vias 29 for heat dissipation. In this embodiment, the bonding sheet 62 being TIM for bonding the semiconductor chip 30 and the heat dissipation body 55 has a very high thermal conductivity. Therefore, excellent heat dissipation of the semiconductor chip 30 is realized without any deterioration of heat dissipation efficiency of the heat dissipation body 55.

As described above, according to this embodiment, the semiconductor device with a high heat dissipating property, that includes the highly reliable heat dissipation mechanism very excellent in heat dissipation efficiency is realized.

According to the embodiments, highly reliable bonding sheet and heat dissipation mechanism which are very excellent in heat dissipation efficiency are realized with a relatively simple structure.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

According to the embodiments, highly reliable bonding sheet and heat dissipation mechanism which are very excellent in heat dissipation efficiency are realized with a relatively simple structure.

What is claimed is:

1. A manufacturing method of a bonding sheet, the method comprising:
   forming a plurality of carbon nanotubes and a film covering upper ends of the plurality of carbon nanotubes, the plurality of carbon nanotubes standing from a base substance;
   injecting, into a gap among the plurality of carbon nanotubes, a first solvent with particles of a first metal;
   eliminating the first solvent from the gap by drying the first solvent; and
   after eliminating the first solvent, injecting, into the gap, a second solvent with particles of a second metal, wherein
   the forming of the plurality of carbon nanotubes and the film includes:
   forming a first layer, as the film, including a plurality of vertical graphenes, the plurality of vertical graphenes standing in a direction vertical to a surface of the base substance; and
   forming the plurality of carbon nanotubes between the base substance and the first layer including a plurality of vertical graphenes.

2. The manufacturing method according to claim 1, wherein
   after injecting the second solvent into the gap, eliminating the second solvent from the gap by drying the second solvent.

3. The manufacturing method according to claim 2, wherein
   the first solvent is a same solvent as the second solvent, and
   the first metal is a same metal as the second metal.

4. The manufacturing method according to claim 3, wherein
   the film includes a metal material.

5. The manufacturing method according to claim 3, wherein
   each of the first solvent and the second solvent is an organic solvent.

6. The manufacturing method according to claim 3, wherein
   in the injecting of the first solvent, the plurality of carbon nanotubes with the film is dipped into a first liquid of the first solvent; and
   in the injecting of the second solvent, the plurality of carbon nanotubes with the film is dipped into a second liquid of the second solvent.

7. The manufacturing method according to claim 1, wherein
   the forming of the first layer includes:
   forming a catalytic film over the base substance;
   forming, over the catalytic film, a second layer including horizontal vertical graphene; and
   forming the first layer between the second film and the catalytic film.

* * * * *